United States Patent
Wang et al.

(10) Patent No.: US 6,949,967 B2
(45) Date of Patent: Sep. 27, 2005

(54) DYNAMICALLY ADJUSTABLE DECOUPLING CAPACITANCE TO REDUCE GATE LEAKAGE CURRENT

(75) Inventors: Wen-Tai Wang, Taipei (TW); Chang-Fen Hu, Pan-Chao (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/669,515

(22) Filed: Sep. 24, 2003

(65) Prior Publication Data

US 2005/0062523 A1 Mar. 24, 2005

(51) Int. Cl.[7] .............................................. G06G 7/019
(52) U.S. Cl. ...................................... 327/337; 327/379
(58) Field of Search ................................ 327/337, 334, 327/336, 341, 344, 379, 384, 389; 326/37–39

(56) References Cited

U.S. PATENT DOCUMENTS

| | | | |
|---|---|---|---|
| 5,506,457 A | 4/1996 | Krauter et al. ............... | 307/129 |
| 5,789,964 A | 8/1998 | Voldman ..................... | 327/380 |
| 6,307,250 B1 | 10/2001 | Krauter et al. .............. | 257/532 |
| 6,392,944 B1 * | 5/2002 | Kono .......................... | 365/208 |
| 6,704,680 B2 * | 3/2004 | Amick et al. ............... | 702/130 |
| 2002/0081832 A1 | 6/2002 | Bernstein et al. | |

OTHER PUBLICATIONS

Article "Interconnect and Circuit Modeling Techniques for Full–Chip Power Supply Noise Analysis," by Chen et al., in IEEE Trans. on Components, Packaging, and Manuf. Tech.–Part B, vol. 21, No. 3, Aug. 1998, pp. 209–215.

* cited by examiner

Primary Examiner—Kenneth B. Wells

(57) ABSTRACT

A new method to reduce switching noise on an integrated circuit device is achieved. The method comprises providing an integrated circuit device comprising a power supply, a ground, and a plurality of switchable capacitors. Each switchable capacitor is connected from the power supply to ground. The operating mode of the integrated circuit device is tracked. An optimal capacitance value is selected based on the operating mode. A set of switchable capacitors from the plurality of switchable capacitors is selected to thereby connect the optimal capacitance value from the power supply to ground.

31 Claims, 5 Drawing Sheets

US 6,949,967 B2

DYNAMICALLY ADJUSTABLE DECOUPLING CAPACITANCE TO REDUCE GATE LEAKAGE CURRENT

BACKGROUND OF THE INVENTION (1) Field of the Invention

The invention relates to an integrated circuit device, and, more particularly, to a method to decouple switching current noise from a power supply of an integrated circuit device.

(2) Description of the Prior Art

Very high-speed integrated circuit devices present many design challenges. For example, synchronized switching of a large number of circuits, as with a very high-speed clock, can create very large switching currents. Referring now to FIG. 1, an exemplary integrated circuit block 10 is illustrated. The circuit block 10 is connected to power supply VDD 14 and ground 18. The circuit block 10 comprises a large number of logic circuits capable of very high-speed operation. During normal operation, internal circuit nodes, such as NODE2 24 and NODE3 26 will switch states as synchronized by the system clock CLK 19. At any time, a large number of nodes may be switching. In addition, if a very high-speed clock frequency is used, then the switching speeds must be very fast. Where both a high switching speed and a high switching rate occur at the same time, a large switching current IVDD 28 is drawn on the VDD 14 line. These large switching currents can cause a substantial amount of switching noise to be coupled onto the VDD line 14 as shown. In very high-speed integrated circuit devices, VDD 14 is often set to a very low value of about 1V. A large switching noise can cause the circuit 10 to malfunction at such a low operating voltage level.

Referring now to FIG. 2, it has been found in the prior art that the addition of capacitance between the power supply VDD 32 and ground VSS 34 of an integrated circuit 30 can reduce the effect of switching current. High frequency components of the switching noise are shunted from VDD 32 to VSS 34 through a decoupling capacitance $C_{D5}$ 36. Referring now to FIG. 3, a particular form of decoupling capacitance $C_D$ 44 from VDD 40 to VSS 42 is shown. $C_D$ 44 may comprise a MOS device such as a polysilicon-oxide-silicon gate. In this case, the decoupling capacitor $C_D$ 44 is cascaded through a resistor $R_D$ 46. Referring now to FIG. 4, an alternative form of the decoupling capacitor from VDD 40 to VSS 42 is illustrated. In this case, one PMOS device P1 47 and one NMOS device N1 48 are cascaded. Each device P1 47 and N1 48 acts as both a capacitor and a resistor.

Referring now to FIG. 5, yet another approach to the decoupling capacitor is illustrated. In this case, a MOS capacitor 62 and a MOS transistor 64 are connected in series between VDD 72 and ground 74. It is observed in the art that, as process technology shrinks to sub-0.13 micron, MOS gate leakage current becomes a serious problem. This leakage occurs because a very thin gate oxide layer 70 is used between the polysilicon 66 and the substrate 50 or n-well 54 to form the gates 62 and 64. At the same time, the supply voltage for a sub-0.13 micron process is typically about 1 Volt while the operating frequency is very high. Therefore, a large decoupling capacitance, perhaps as large as the total gate capacitance of the circuit, is required to suppress switching noise on the supply VDD 72. Unfortunately, when very large decoupling capacitors 62 are formed using MOS gates, the large gate leakage can cause an unacceptable current drain on the circuit. In addition, the large gate area of the decoupling capacitors 62 is a likely location for a gate defect that can cause the capacitor to be shorted.

It is found in the prior art that the series connected MOS transistor 64 may be used as a switch to shut OFF the decoupling capacitor 62 connection to ground 74. In particular, the decoupling capacitor 62 may be tested for excessive leakage during power-up. If excessive leakage is detected, then the MOS switch 64 is shut OFF during all circuit operation. In any case, after power-up, the MOS switch 64 is controlled by a static signal 76.

Several prior art inventions relate to methods to decouple switching current noise from a power supply of an integrated circuit device. U.S. Pat. No. 5,506,457 to Krauter et al and U.S. Pat. No. 6,307,250 B1 to Krauter et al teach a circuit to detect a defective decoupling capacitor during a power-up test. The defective capacitor is switched out of the circuit. U.S. Pat. No. 5,789,964 to Voldman shows a method to detect a defective decoupling capacitor during power-up and to switch in a capacitor during an ESD event. U.S. patent application Ser. No. 2002-0081832 A1 to Bernstein et al describes a circuit to test decoupling capacitors in an integrated circuit device. If a decoupling capacitor fails, then a fuse is blown to disable a grounding switch. Finally, in the article, "Interconnect and Circuit Modeling Techniques for Full-Chip Power Supply Noise Analysis," by Chen et al, in IEEE Transactions on Components, Packaging, and Manufacturing Technology—Part B, Vol. 21, No. 3, August. 1998, pp. 209–215, a capacitor and switch combination is described.

SUMMARY OF THE INVENTION

A principal object of the present invention is to provide an effective and very manufacturable method to reduce switching noise on an integrated circuit power supply.

A further object of the present invention is to reduce switching noise while limiting current leakage.

A yet further object of the present invention is to provide a dynamically adjusted, decoupling capacitance that depends on the capacitive loading that is switching in the circuit.

A yet further object of the present invention is to provide a method to reduce switching noise that is applicable to a variety of switchable capacitor arrangements.

Another further object of the present invention is to provide an integrated circuit device with reduced switching noise on the power supply.

A yet further object of the present invention is to provide an integrated circuit device with a dynamically adjusted, decoupling capacitance that depends on the capacitive loading that is switching in the circuit.

A yet further object of the present invention is to provide an integrated circuit device with a dynamically adjustable, decoupling capacitance in a variety of switchable capacitor arrangements.

In accordance with the objects of this invention, a method to reduce switching noise on an integrated circuit device is achieved. The method comprises providing an integrated circuit device comprising a power supply, a ground, and a plurality of switchable capacitors. Each switchable capacitor is connected from the power supply to ground. The operating mode of the integrated circuit device is tracked. An optimal capacitance value is selected based on the operating mode. A set of switchable capacitors from the plurality of switchable capacitors is selected to thereby connect the optimal capacitance value from the power supply to ground.

Also in accordance with the objects of this invention, an integrated circuit device is achieved. The device comprises a power supply, a ground, and a plurality of switchable capacitors. Each switchable capacitor is connected from the power supply to the ground. A means of tracking the operating mode of the integrated circuit device is included. A means of selecting an optimal capacitance value based on the operating mode is included. Finally, a means of selecting a set of switchable capacitors from the plurality of switchable capacitors is used to thereby connect the optimal capacitance value from the power supply to the ground.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to reduce switching noise in a power supply of an integrated circuit device. A method to dynamically adjust decoupling capacitance is disclosed. A device is described wherein dynamic adjustment of decoupling capacitance is achieved. It should be clear to those experienced in the art that the present invention can be applied and extended without deviating from the scope of the present invention.

Figure 1:
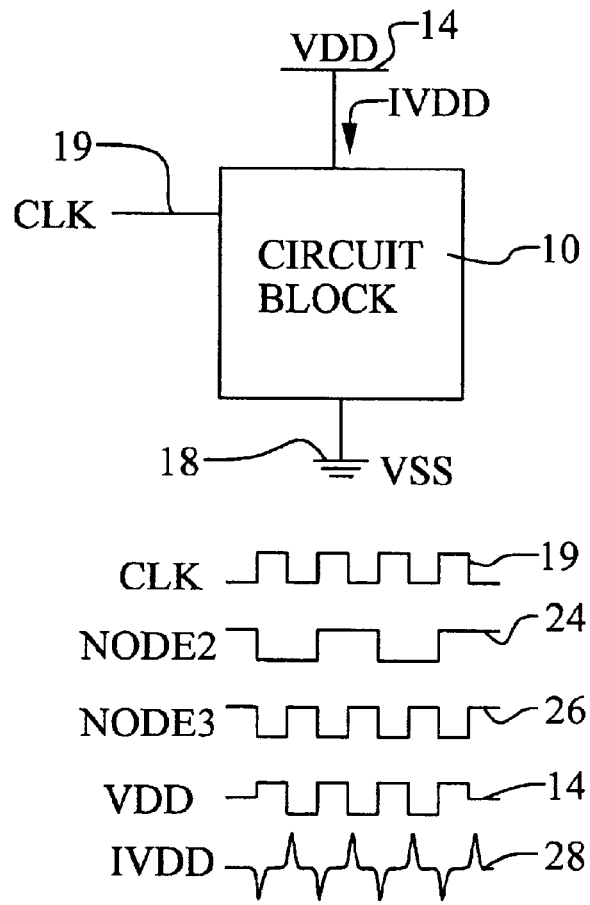
FIG. 1 illustrates switching noise coupling onto the power supply of a circuit block.
Figure 2:
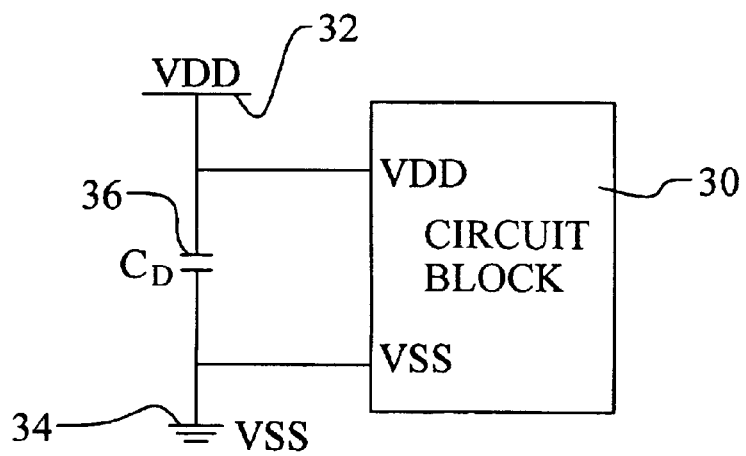
FIG. 2 illustrates a prior art approach to decoupling high frequency switching noise for a power supply.
Figure 3:
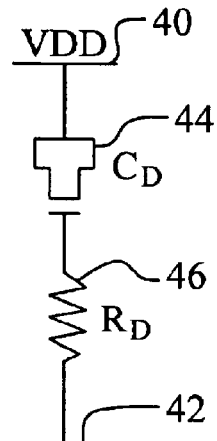
FIGS. 3 and 4 illustrate prior art decoupling capacitor configurations.
Figure 4:
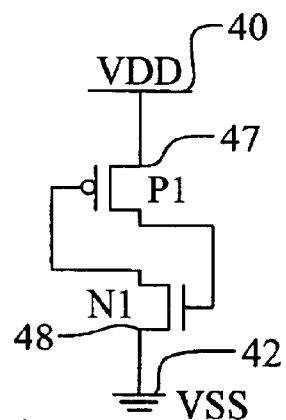
Figure 5:
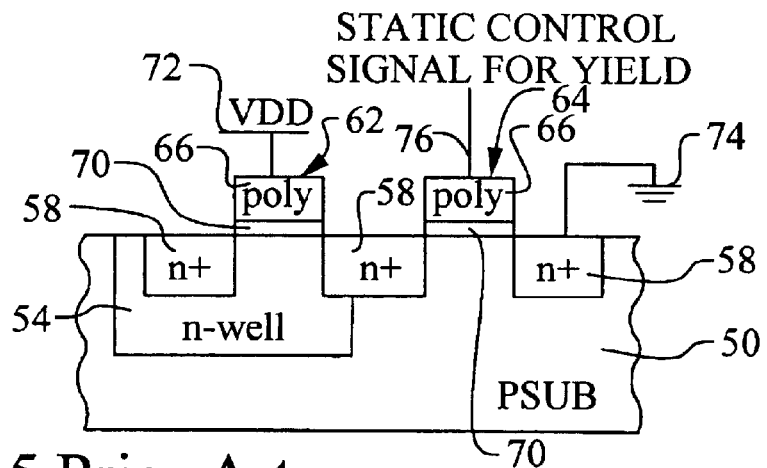
FIG. 5 illustrates a prior art switchable capacitor used for decoupling.
Figure 6:
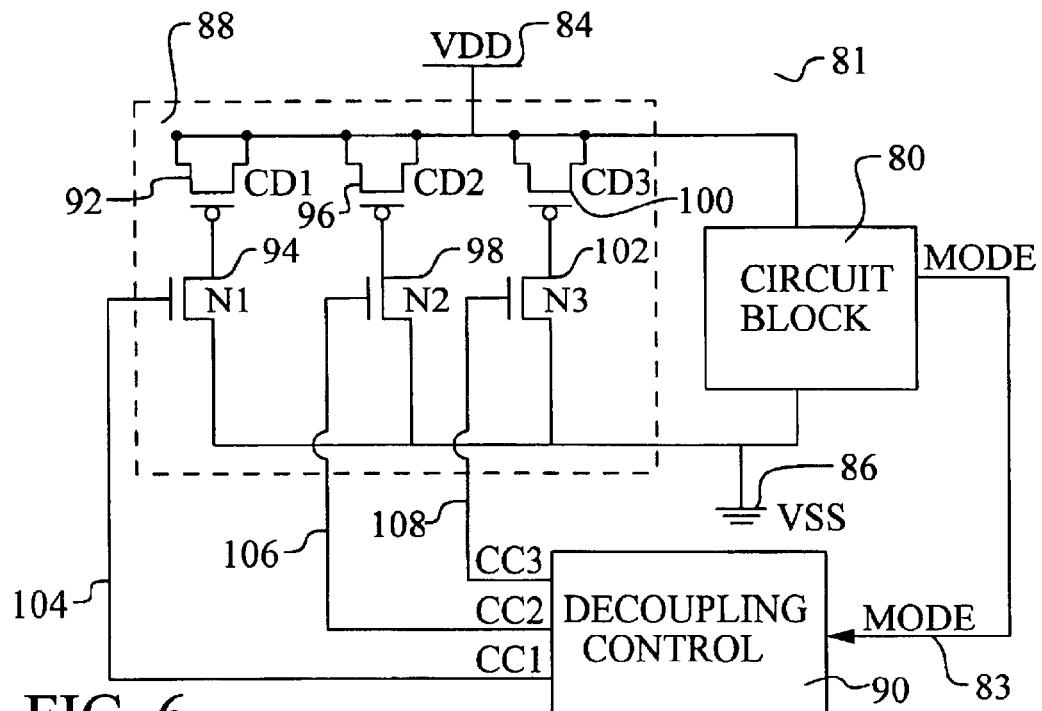
FIG. 6 illustrates a first preferred embodiment of the present invention.

Referring now to FIG. 6, a first preferred embodiment of the present invention is illustrated. Several important features of the present invention are shown and discussed below. In the first embodiment, an integrated circuit 81 first comprises a circuit block 80. The circuit block 80 preferably comprises a plurality of logic circuits capable of switching digital states. The circuit block 80 may be the entire logic section of the integrated circuit 81 or may be only one of several blocks. In the case of multiple sections or blocks 80, then the method and architecture of the present invention may be repeated to provide dynamically controlled, decoupling capacitance for each block independently.

The circuit block 80 is connected to a power supply VDD 84 and to a ground VSS 86. Alternatively, the circuit block 80 may be connected to more than one power supply and/or ground. The method and architecture of the present invention may be duplicated for each power/ground combination as needed. It should be understood that the terms power supply and upper voltage node are used interchangeably herein to describe the upper voltage node within the integrated circuit that is commonly designated VDD. Likewise, the term ground is used herein to describe the lower voltage node within the integrated circuit that is commonly designated by VSS. The actual source of the power supply, be it a battery or a power regulating circuit, is not of particular importance to the teachings the present invention. Further, integrated circuit embodiments of formed under the teachings of the present invention may derive power from an off-chip source. In this preferred embodiment, the circuit block 80 comprises a large number of logic gates and transistors capable of switching at very high speed. Further, the circuit block 80 is preferably synchronized with a high-speed system clock. Finally, the circuit block 80 preferably comprises a sub-0.13 micron technology. In combination, these preferred embodiments dictate the use of decoupling capacitance 88 to reduce switching noise on the power supply VDD 84.

As an important feature, the decoupling capacitance 88 of the present invention is formed using a plurality of switchable capacitors. In this particular example, three capacitors CD1 92, CD2 96, and CD3 100 are used to create a combined decoupling capacitance 88. Each capacitor is made switchable by the presence of a series switch N1 94, N2 98, and N3 102 between the capacitor and VSS 86. Each capacitor and switch pair, such as CD1 92 and N1 94, represents a single, switchable capacitor according to the teachings of the present invention. In this embodiment, the capacitors CD1 92, CD2 96, and CD3 100, each comprise a MOS device. In particular, each capacitor comprises a PMOS transistor. In this embodiment, the switches N1 94, N2 98, and N3 102, each comprise a MOS device. In particular, each switch comprises an NMOS transistor. Finally, in this embodiment, the capacitors CD1, CD2, and CD3 are connected to VDD 84 while switches N1, N2, and N3 are connected to VSS 86.

As another important feature, each switchable capacitor is controlled independently. In particular, the first switchable capacitor pair CD1 92 and N1 94 is controlled by signal CC1 104, the second switchable capacitor pair CD2 96 and N2 98 is controlled by signal CC2 106, and the third switchable capacitor pair CD3 100 and N3 102 is controlled by signal CC3 108. By this configuration, it is possible to selectively connect or disconnect each switchable capacitor from VDD 84 to VSS 86. It is therefore possible to select different values of decoupling capacitance by the parallel combination of the capacitors. For example, if all of the switchable capacitors are selected, or switched ON, then the decoupling capacitance is the sum of the values or CD1+CD2+CD3. If all of the capacitors are de-selected, or turned OFF, then the decoupling capacitance is zero. Any combination of capacitors can be selected such as CD1, or CD2+CD3, and so on.

The schematic depicts a combined decoupling capacitance 88 comprising three switchable capacitors. However, in practice, a much larger number of switchable capacitors could be used. If, for example, 1000 switchable capacitors, are used, then a large number of sets of selected capacitor combinations would be possible. The largest decoupling capacitance value (CMAX) for such a capacitor set would simply be the sum of all the capacitors. The smallest value would simply be zero. If all of the 1000 capacitors comprise the same value, then any value between CMAX and 0 could be selected with a resolution of CMAX/1000.

As another important feature of the present invention, a means of controlling 90 the plurality of switchable capacitors 88 is provided. In particular, a decoupling controller 90 is used. The decoupling controller 90 tracks the operating mode MODE 83 of the circuit block 80. This operating mode MODE 83 is then used to select an optimal decoupling capacitance. This optimal decoupling capacitance is a value from zero to CMAX as described above. Finally, the decoupling controller 90 selectively asserts or de-asserts the control signals CC1 104, CC2 106, and CC3 108 to thereby selectively connect capacitors CD1 92, CD2 96, and CD3 100 between VDD 84 and VSS 86 such that the desired, optimal decoupling capacitance value is deployed. Note that the MODE signal may comprise a single signal or a plurality of signals. Further, MODE may comprise a digital or an analog signal.

As described in the prior analysis, it is very useful to use MOS devices to form the decoupling capacitors. However, in sub-0.13 micron technology, such devices can exhibit excessive current leakage. This current leakage increases die heating and, in battery operated systems, leads to unacceptable drain on the battery. Therefore, it is desirable to only turn ON the MOS-based, decoupling capacitors when absolutely necessary. The novel approach of the present invention provides this capability.

For example, if the circuit block 80 is operating in a high speed, high switching mode where a high percentage of the total circuit capacitance is being rapidly switched, then a large decoupling capacitance 88 is needed to effectively shunt the switching current from VDD 84 to VSS 86. In this case, the MODE 83 will indicate to the decoupling controller 90 that the circuit block 80 is in a high capacitive switching mode. The decoupling controller 90 will respond by turning ON most, or all, of the available switchable capacitors. Alternatively, if the circuit block 80 is operating in a low switching mode, then the MODE signal 83 will indicate this to the decoupling controller 90. In turn, the decoupling controller 90 will shut OFF most, or all, of the available switchable capacitors. Finally, if the circuit block 80 is in a power saving state, then the MODE signal 83 state will direct the decoupling controller 90 to shut OFF all the capacitors. In this way, the present invention provides a method to dynamically select an optimal decoupling capacitance. This optimal decoupling capacitance provides the necessary switching noise reduction while maintaining a minimal leakage current.

Figure 9:
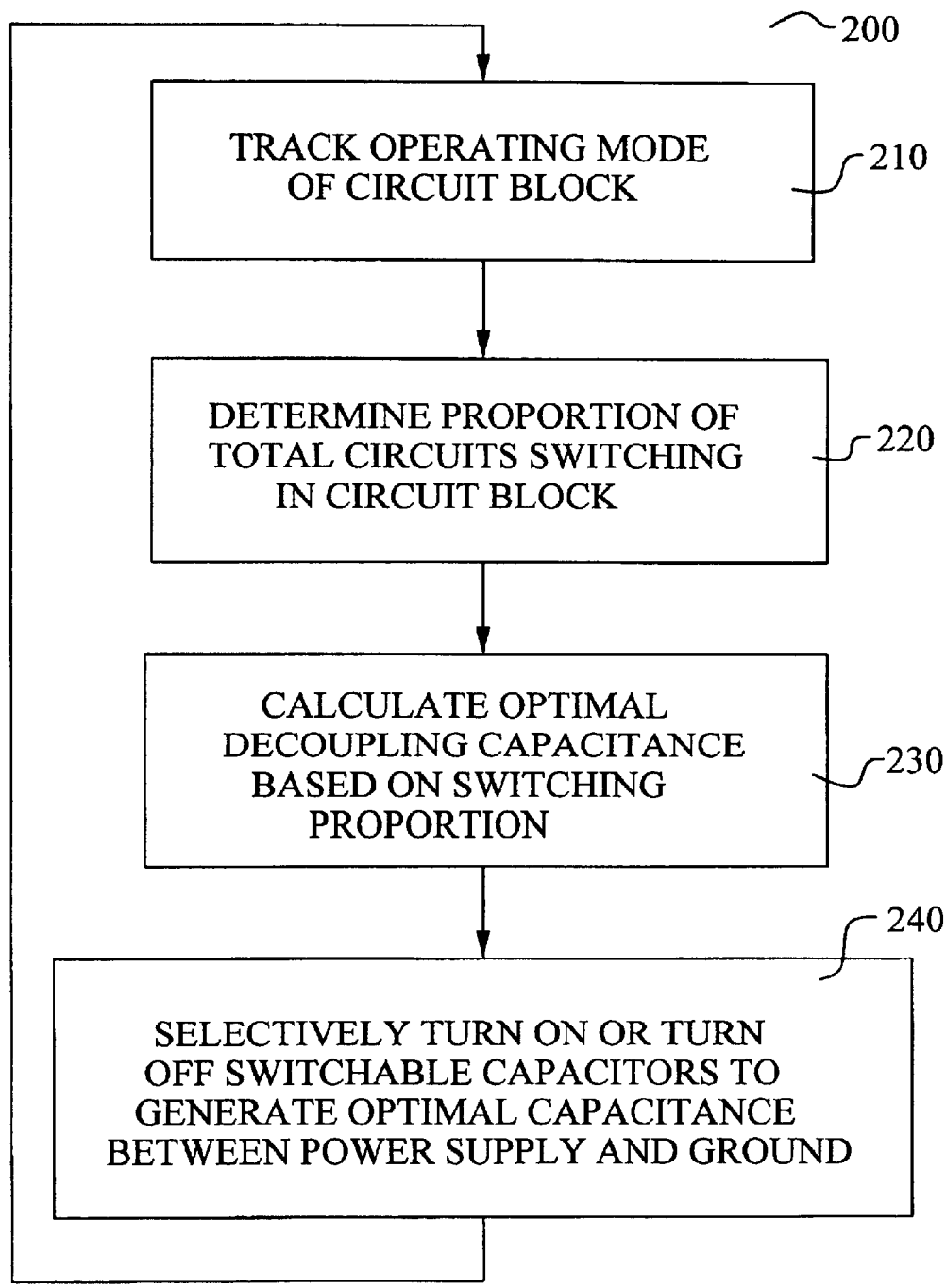
FIG. 9 illustrates a preferred embodiment of the method of the present invention.

Referring now to FIG. 9, the preferred method 200 of dynamically controlling the decoupling capacitance is graphically depicted. The operating mode of the circuit block is tracked in step 210. Based on the operating mode, the number of switching circuits versus total circuits is determined in step 220. This proportion is called the toggle rate. The toggle rate for various operating modes may easily be determined during the design phase of the circuit block using a circuit simulator. In particular, the circuit block is simulated over a range of operating modes. In each operating mode, the toggle rate is logged. In addition, the toggle rate may be converted into a proportion of switching capacitance. In this case, the capacitance of the switching elements, such as transistors or gates, is divided by the total capacitance of all of the circuit block elements to develop a proportion of switching capacitance for that operating mode of the circuit.

The total capacitance of the circuit block is called the intrinsic capacitance ($C_{INTRINSIC}$). At any given time, each capacitive element in the circuit is either switching or not switching. In this regard, it may be concluded that:

$$C_{INTRINSIC} = C_{SWITCHING} + C_{NONSWITCHING}.$$

To effectively decouple the switching current from the power supply, it is found that the amount of decoupling capacitance must be increased as $C_{SWITCHING}$ increases. Further, it is found that the decoupling capacitance must be significantly larger than $C_{SWITCHING}$. In particular, it is found that an optimal relationship is given by:

$$N \times C_{SWITCHING} + C_{NONSWITCHING} + C_{DECOUPLING},$$

where N is between about 8 and 10. Therefore, for each operating mode of the circuit block, the above rule is preferably applied to determine the optimal decoupling capacitance based on switching proportion in step 230. Note that additional rules, such as zeroing the decoupling capacitance value during power saving mode, may be applied.

A set of capacitors from the plurality of available capacitors is then selected to form the optimal capacitance value. In particular, the switchable capacitors are selectively turned ON or turned OFF to effectively generate the optimal decoupling capacitance between the power supply and ground in step 240. As described above, the value resolution will depend on the number of capacitors. Finally, note that the method is continuous. That is, the operating mode is continually tracked so that the decoupling capacitance can be dynamically adjusted at all times.

Referring again to FIG. 6, as a particular example, the capacitor CD1 92 is formed as a PMOS transistor. In an exemplary process, a capacitor of about 3.6 nF may be formed using a gate width of about $2 \times 10^5$ microns and a gate length of about 2 microns. Such a capacitor is found to exhibit a gate leakage of about 911 microAmps. By comparison, a same sized NMOS capacitor will exhibit about 205 microAmps of gate leakage. Neither of these values is acceptable as a standby current. However, by adding the NMOS switch N1 94, this standby current can be dramatically reduced. By turning OFF the NMOS switch, the switchable capacitor exhibits a leakage from VDD 84 to VSS 86 of only about 7 microAmps using an NMOS switch having a gate width of about $1 \times 10^5$ microns and a gate length of about 0.26 microns. Experimental data reveals that the impedance of the switchable capacitor varies with different sizes of the NMOS switch. Switches with very large widths are found to have minimal impact on the ON-state impedance value as compared to a capacitor with no switch.

There are many alternatives to the above example. For example, the gate length of the NMOS switch can be made substantially longer to further reduce the OFF state leakage. Another alternative is to use an NMOS switch with a higher threshold voltage. This will further reduce the OFF state leakage. Such high Vt NMOS devices are freely available in many SRAM processes.

Figure 7:
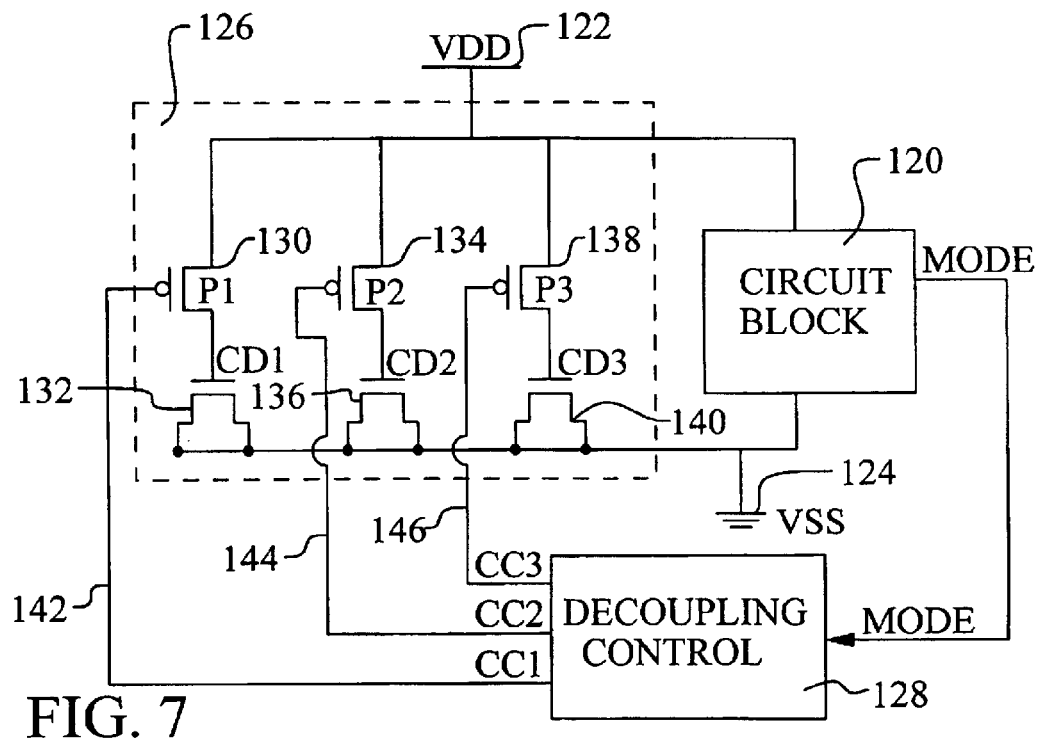
FIG. 7 illustrates a second preferred embodiment of the present invention.

Referring now to FIG. 7, a second preferred embodiment of the circuit of the present invention is illustrated. Once again, the circuit block 120 is connected to VDD 122 and to ground 124. In this case, however, the decoupling capacitance 126 comprises a plurality of switchable capacitors wherein the capacitors CD1 132, CD2 136, and CD3 140, are formed using NMOS devices and the switches P1 130, P2 134, and P3 138, are formed using PMOS devices. The NMOS capacitors are connected to the VSS rail 124 while the switches are connected to the VDD rail 122. The circuit operates in similar fashion to the first embodiment. However, the decoupling controller 128 must invert the control signals CC1 142, CC2 144, and CC3 146 to control the PMOS switches. Once again, the decoupling capacitor 126 may comprise a very large number of switched capacitors.

Figure 8:
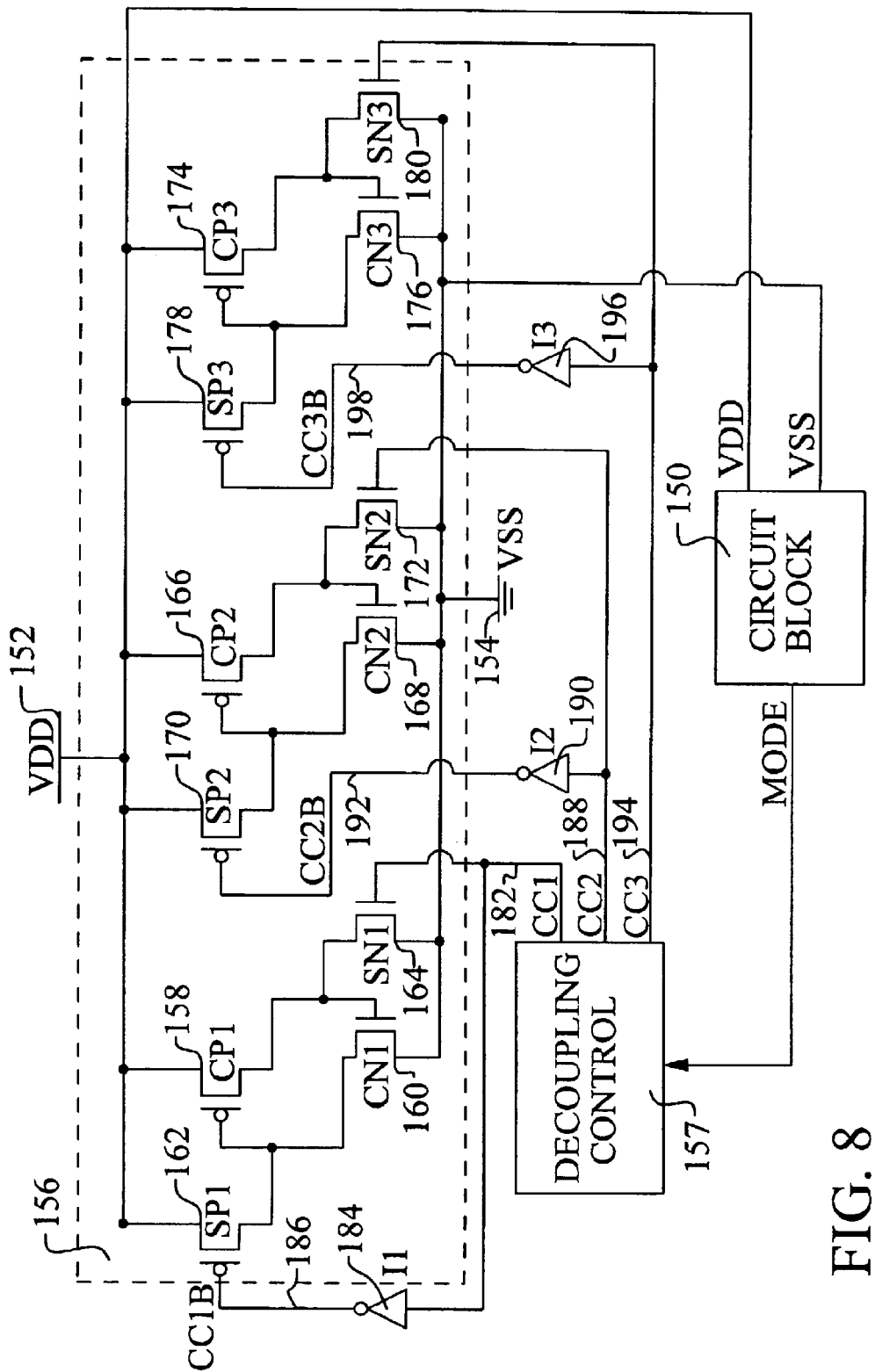
FIG. 8 illustrates a third preferred embodiment of the present invention.

Referring now to FIG. 8, a third preferred embodiment of the present invention is illustrated. In this case, the decoupling capacitor comprises a more complex form of switchable capacitors. Each switchable capacitor comprises four MOS devices. In particular, a first switchable capacitor comprises PMOS devices SP1 162 and CP1 158 and NMOS devices CN1 160 and SN1 164. PMOS transistor CP1 158 has source, drain, and gate terminals. The source terminal is coupled to the power supply VDD 152. NMOS transistor CN1 160 has source, drain, and gate terminals. The source terminal is coupled to VSS 154. The drain terminal is coupled to gate terminal of CP1 158. The gate terminal of CN1 160 is coupled to drain terminal of CP1 158. A first switch SP1 162 comprises a PMOS transistor coupled between the gate terminal of CP1 158 and VDD 152. A second switch comprises an NMOS transistor SN1 164 coupled between the gate terminal of CN1 160 and VSS 154.

Each switched capacitor is controlled independently by the decoupling controller 157. In this case, non-inverted control signals CC1 182, CC2 188, and CC3 194, and inverted control signals CC1B 186, CC2B 192, and CC3B 198, are used to control the pairs of switches for each switched capacitor. In the ON state, the switches are both turned OFF to allow, for example, CP1 158 and CN1 160 to act as both capacitors and resistors. In the OFF state, the switches, such as SP1 162 and SN1 164, are turned ON to thereby turn OFF CP1 158 and CN1 160. There is no leakage current path.

The advantages of the present invention may now be summarized. An effective and very manufacturable method to reduce switching noise on an integrated circuit power supply is achieved. The method reduces switching noise while limiting current leakage. A dynamically adjusted, decoupling capacitance is selected depending on the capacitive loading that is switching in the circuit. The method to reduce switching noise is applicable to a variety of switchable capacitor arrangements. An integrated circuit device with reduced switching noise on the power supply is achieved. The integrated circuit device has a dynamically adjusted, decoupling capacitance depending on the capacitive loading that is switching in the circuit. The integrated circuit device with a dynamically adjustable, decoupling capacitance is achievable in a variety of switchable capacitor arrangements.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to reduce switching noise on an integrated circuit device, said method comprising:
    providing an integrated circuit device comprising an upper voltage node, a ground, and a plurality of switchable capacitors wherein each said switchable capacitor is connected from said upper voltage node to said ground;
    tracking an operating mode of said integrated circuit device;
    selecting an optimal capacitance value based on said operating mode by determining a proportion of total circuits in said integrated circuit device that are switching in said operating mode and calculating said optimal capacitance value based on said proportion; and
    selecting a set of said switchable capacitors from said plurality of switchable capacitors to thereby connect said optimal capacitance value from said upper voltage node to said ground.

2. The method according to claim 1 wherein said optimal capacitance value is calculated using a formula based on capacitance loading in switching circuits and capacitance loading in non-switching circuits.

3. The method according to claim 1 wherein said operating mode comprises a power-saving mode.

4. The method according to claim 1 wherein said switchable capacitors each comprise a capacitor and a switch connected in series.

5. The method according to claim 4 wherein said capacitor comprises an MOS device.

6. The method according to claim 4 wherein said capacitor is connected to said upper voltage node and said switch is connected to said ground.

7. The method according to claim 4 wherein said capacitor is connected to said ground and said switch is connected to said upper voltage node.

8. The method according to claim 4 wherein said switch comprises an MOS transistor.

9. The method according to claim 1 wherein said switchable capacitors each comprise:
    a PMOS transistor having source, drain, and gate terminals wherein said source terminal is coupled to said upper voltage node;
    an NMOS transistor having source, drain, and gate terminals wherein said source terminal is coupled to said ground, wherein said drain terminal is coupled to said PMOS transistor gate terminal, and wherein said gate terminal is coupled to said PMOS transistor drain terminal;
    a first switch coupled between said PMOS transistor gate terminal and said upper voltage node; and
    a second switch coupled between said NMOS transistor gate terminal and said ground.

10. The method according to claim 9 wherein said first and second switches comprise MOS transistors.

11. A method to reduce switching noise on an integrated circuit device, said method comprising:
    providing an integrated circuit device comprising an upper voltage node, a ground, and a plurality of switchable capacitors wherein each said switchable capacitor is connected from said upper voltage node to said ground and wherein said switchable capacitors each comprise a capacitor and a switch connected in series;
    tracking the operating mode of said integrated circuit device;
    selecting an optimal capacitance value based on said operating mode by a method comprising:
        determining a proportion of total circuits in said integrated circuit device that are switching in said operating mode; and
        calculating said optimal capacitance value based on said proportion; and
    selecting a set of said switchable capacitors from said plurality of switchable capacitors to thereby connect said optimal capacitance value from said upper voltage node to said ground.

12. The method according to claim 11 wherein said optimal capacitance value is calculated using a formula based on capacitance loading in switching circuits and capacitance loading in non-switching circuits.

13. The method according to claim 11 wherein said operating mode comprises a power-saving mode.

14. The method according to claim 11 wherein said capacitor comprises an MOS device.

15. The method according to claim 11 wherein said capacitor is connected to said upper voltage node and said switch is connected to said ground.

16. The method according to claim 11 wherein said capacitor is connected to said ground and said switch is connected to said upper voltage node.

17. The method according to claim 11 wherein said switch comprises an MOS transistor.

18. An integrated circuit device comprising:

an upper voltage node;

a ground;

a plurality of switchable capacitors wherein each said switchable capacitor is connected from said upper voltage node to said ground;

means for tracking the operating mode of said integrated circuit device;

means for selecting an optimal capacitance value based on said operating mode; and means for selecting a set of said switchable capacitors from said plurality of switchable capacitors to thereby connect said optimal capacitance value from said upper voltage node to said ground.

19. The device according to claim 18 wherein said means of selecting an optimal capacitance value based on said operating mode comprises:

means for determining a proportion of total circuits in said integrated circuit device that are switching in said operating mode; and means for calculating said optimal capacitance value based on said proportion.

20. The device according to claim 19 wherein said optimal capacitance value is calculated using a formula based on capacitance loading in switching circuits and capacitance loading in non-switching circuits.

21. The device according to claim 18 wherein said operating mode comprises a power-saving mode.

22. The device according to claim 18 wherein said switchable capacitors each comprise a capacitor and a switch connected in series.

23. The device according to claim 22 wherein said capacitor comprises an MOS device.

24. The device according to claim 22 wherein said capacitor is connected to said upper voltage node and said switch is connected to said ground.

25. The device according to claim 22 wherein said capacitor is connected to said ground and said switch is connected to said upper voltage node.

26. The device according to claim 22 wherein said switch comprises an MOS transistor.

27. The device according to claim 18 wherein said switchable capacitors each comprise:

a PMOS transistor having source, drain, and gate terminals wherein said source terminal is coupled to said upper voltage node;

an NMOS transistor having source, drain, and gate terminals wherein said source terminal is coupled to said ground, wherein said drain terminal is coupled to said PMOS transistor gate terminal, and wherein said gate terminal is coupled to said PMOS transistor drain terminal;

a first switch coupled between said PMOS transistor gate terminal and said upper voltage node; and a second switch coupled between said NMOS transistor gate terminal and said ground.

28. The device according to claim 27 wherein said first and second switches comprise MOS transistors.

29. The device according to claim 27 wherein said first and second switches are controlled by a single signal.

30. A method to reduce switching noise on an integrated circuit device, said method comprising:

providing an integrated circuit device comprising an upper voltage node, a ground, and a plurality of switchable capacitors wherein each said switchable capacitor is connected from said upper voltage node to said ground;

tracking an operating mode of said integrated circuit device;

selecting an optimal capacitance value based on said operating mode by determining a proportion of total circuits in said integrated circuit device that are switching in said operating mode and calculating said optimal capacitance value based on said proportion; and selecting a set of said switchable capacitors from said plurality of switchable capacitors to thereby connect said optimal capacitance value from said upper voltage node to said ground.

31. An integrated circuit device comprising:

an upper voltage node;

a ground;

a plurality of switchable capacitors wherein each said switchable capacitor is connected from said upper voltage node to said ground;

means for tracking the operating mode of said integrated circuit device;

means for selecting an optimal capacitance value based on said operating mode; and means for selecting a set of said switchable capacitors from said plurality of switchable capacitors to thereby connect said optimal capacitance value from said upper voltage node to said ground, wherein said means of selecting an optimal capacitance value based on said operating mode comprises:

means for determining a proportion of total circuits in said integrated circuit device that are switching in said operating mode; and means for calculating said optimal capacitance value based on said proportion.

* * * * *